United States Patent
Kil et al.

(10) Patent No.: US 12,250,004 B2
(45) Date of Patent: Mar. 11, 2025

(54) STORAGE DEVICE PERFORMING ERROR CORRECTION AND OPERATING METHOD OF STORAGE DEVICE

(71) Applicant: Samsung Electronics Co., Ltd., Suwon-si (KR)

(72) Inventors: YongSung Kil, Suwon-si (KR); Soonyoung Kang, Suwon-si (KR); Hong Rak Son, Suwon-si (KR); Kangseok Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 22 days.

(21) Appl. No.: 18/318,874

(22) Filed: May 17, 2023

(65) Prior Publication Data

US 2024/0128986 A1    Apr. 18, 2024

(30) Foreign Application Priority Data

Oct. 18, 2022  (KR) .................. 10-2022-0134370

(51) Int. Cl.
*H03M 13/11*    (2006.01)
*G06F 11/10*    (2006.01)

(52) U.S. Cl.
CPC ..... *H03M 13/1177* (2013.01); *G06F 11/1004* (2013.01)

(58) Field of Classification Search
CPC ............. G06F 11/1004; G06F 11/1012; G06F 11/1048; H03M 13/1177
See application file for complete search history.

(56) References Cited

U.S. PATENT DOCUMENTS

| | | | |
|---|---|---|---|
| 7,679,133 B2 | 3/2010 | Son et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 9,128,710 B2 | 9/2015 | Subramanian et al. | |
| 9,293,210 B2 | 3/2016 | Jang et al. | |
| 9,472,298 B1 | 10/2016 | Louie et al. | |
| 9,483,347 B2 | 11/2016 | Wu et al. | |
| 10,158,380 B2 | 12/2018 | Sharon et al. | |
| 10,276,247 B2 | 4/2019 | Alhussien et al. | |
| 10,915,395 B2 | 2/2021 | Luo et al. | |
| 11,128,314 B2 | 9/2021 | Zhang et al. | |
| 2011/0233648 A1 | 9/2011 | Seol et al. | |
| 2015/0019934 A1* | 1/2015 | Chae .................. | G06F 11/1048 714/764 |
| 2017/0123898 A1 | 5/2017 | Ryabinin et al. | |
| 2017/0235633 A1 | 8/2017 | Park | |

(Continued)

FOREIGN PATENT DOCUMENTS

| | | |
|---|---|---|
| GB | 2533639 A | 6/2016 |
| KR | 10-2014-0071783 A | 6/2014 |

*Primary Examiner* — Shelly A Chase

(74) *Attorney, Agent, or Firm* — Harness, Dickey & Pierce, P.L.C.

(57) ABSTRACT

Disclosed is a storage device which includes a nonvolatile memory device, and a memory controller that performs a read operation on the nonvolatile memory device and performs an error correction operation on data read in the read operation. In the error correction operation, the memory controller estimates an error rate of the read data, and determines whether to perform a read retry operation based on the estimated error rate.

19 Claims, 13 Drawing Sheets

(56) References Cited

U.S. PATENT DOCUMENTS

| | | |
|---|---|---|
| 2017/0294217 A1 | 10/2017 | Lin et al. |
| 2018/0137003 A1* | 5/2018 | Pignatelli ............ G06F 11/1012 |
| 2020/0119751 A1 | 4/2020 | Kim |
| 2021/0224151 A1* | 7/2021 | Lee ...................... G11C 29/021 |
| 2023/0144171 A1* | 5/2023 | Kojima .............. G11C 16/3422 |
| | | 365/185.11 |

* cited by examiner

STORAGE DEVICE PERFORMING ERROR CORRECTION AND OPERATING METHOD OF STORAGE DEVICE

CROSS-REFERENCE TO RELATED APPLICATIONS

This application claims priority under 35 U.S.C. § 119 to Korean Patent Application No. 10-2022-0134370 filed on Oct. 18, 2022, in the Korean Intellectual Property Office, the disclosures of which are incorporated by reference herein in its entirety.

BACKGROUND

Example embodiments of the present disclosure described herein relate to an electronic device, and more particularly, relate to a storage device performing error correction with an improved speed and an operating method of the storage device.

A storage device refers to a device, which stores data under control of a host device, such as a computer, a smartphone, or a smart pad. The storage device includes a device, which stores data on a magnetic disk, such as a hard disk drive (HDD), or a device, which stores data in a semiconductor memory, in particular, a nonvolatile memory, such as a solid state drive (SSD) or a memory card.

A nonvolatile memory includes a read only memory (ROM), a programmable ROM (PROM), an electrically programmable ROM (EPROM), an electrically erasable and programmable ROM (EEPROM), a flash memory, a phase-change random access memory (PRAM), a magnetic RAM (MRAM), a resistive RAM (RRAM), a ferroelectric RAM (FRAM), etc.

An error may occur in the process of storing data in the storage device, while the storage device stores data, or in the process of reading data from the storage device. To correct the error, the storage device may perform error correction. As a time necessary for error correction increases, a read time of the storage device may increase.

SUMMARY

Example embodiments of the present disclosure provide a storage device performing error correction with an improved speed and an operating method of the storage device.

According to an example embodiment, a storage device includes a nonvolatile memory device, and a memory controller that performs a read operation on the nonvolatile memory device and performs an error correction operation on data read in the read operation. In the error correction operation, the memory controller estimates an error rate of the read data, and determines whether to perform a read retry operation based on the estimated error rate.

According to an example embodiment, a storage device includes a nonvolatile memory device, and a memory controller that performs a read operation on the nonvolatile memory device and performs an error correction operation on data read in the read operation. In the error correction operation, the memory controller estimates an error rate of the read data, and performs one of a low density parity check (LDPC) decoding operation for the read data and a read retry operation of reading additional data from the nonvolatile memory device, based on the error rate.

According to an example embodiment, an operating method of operating a storage device including a nonvolatile memory device and a memory controller includes sending, at the memory controller, a first read command to the nonvolatile memory device, performing, at the nonvolatile memory device, a first read operation in response to the first read command and sending first data as a result of the first read operation to the memory controller, estimating, at the memory controller, an error rate of the first data, performing, at the memory controller, a hard decision decoding operation on the first data in response to the estimated error rate being equal to or smaller than a threshold value, and sending, at the memory controller, a second read command to the nonvolatile memory device in response to the estimated error rate being greater than the threshold value.

BRIEF DESCRIPTION OF THE FIGURES

The above and other objects and features of the present disclosure will become apparent by describing in detail example embodiments thereof with reference to the accompanying drawings.

DETAILED DESCRIPTION

Below, example embodiments of the present disclosure will be described in detail and clearly to such an extent that an ordinary one in the art easily implements the present disclosure. Below, the term "and/or" is interpreted as including any one of items listed with regard to the term, or a combination of some of the listed items.

Figure 1:
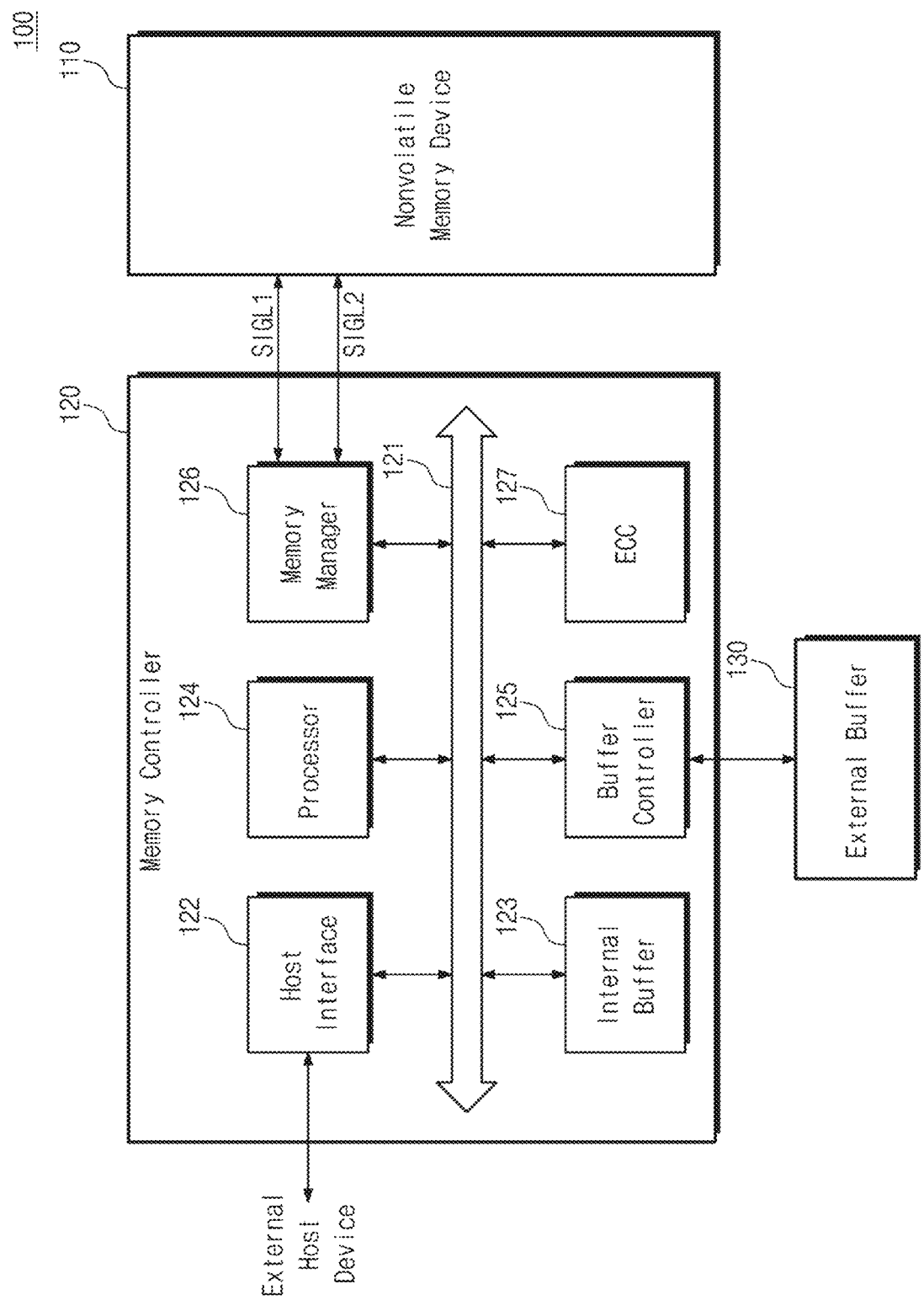
FIG. 1 is a diagram illustrating a storage device according to an example embodiment of the present disclosure.

FIG. 1 illustrates a storage device 100 according to an example embodiment of the present disclosure. Referring to FIG. 1, the storage device 100 may include a nonvolatile memory device 110, a memory controller 120, and an external buffer 130. The nonvolatile memory device 110 may include a plurality of memory cells. Each of the plurality of memory cells may store two or more bits.

For example, the nonvolatile memory device 110 may include at least one of various nonvolatile memory devices such as a flash memory device, a phase change memory device, a ferroelectric memory device, a magnetic memory device, and a resistive memory device.

The memory controller 120 may receive various requests for writing data in the nonvolatile memory device 110 or reading data from the nonvolatile memory device 110 from an external host device. The memory controller 120 may store (or buffer) user data, which are transmitted/received to/from the external host device, in the external buffer 130 and may store metadata for managing the storage device 100 in the external buffer 130.

The memory controller 120 may access the nonvolatile memory device 110 through first signal lines SIGL1 and second signal lines SIGL2. For example, the memory controller 120 may send a command and an address to the nonvolatile memory device 110 through the first signal lines SIGL1. The memory controller 120 may exchange data with the nonvolatile memory device 110 through the first signal lines SIGL1.

The memory controller 120 may send a first control signal to the nonvolatile memory device 110 through the second signal lines SIGL2. The memory controller 120 may receive a second control signal from the nonvolatile memory device 110 through the second signal lines SIGL2.

In an example embodiment, the memory controller 120 may be configured to control two or more nonvolatile memory devices. The memory controller 120 may provide first signal lines and second signal lines for each of the two or more nonvolatile memory devices.

As another example, the memory controller 120 may share the first signal lines with respect to the two or more nonvolatile memory devices. The memory controller 120 may share some of the second signal lines with respect to the two or more nonvolatile memory devices and may separately provide the others thereof.

The external buffer 130 may include a random access memory. For example, the external buffer 130 may include at least one of a dynamic random access memory, a phase change random access memory, a ferroelectric random access memory, a magnetic random access memory, or a resistive random access memory.

The memory controller 120 may include a bus 121, a host interface 122, an internal buffer 123, a processor 124, a buffer controller 125, a memory manager 126, and an error correction code (ECC) block 127.

The bus 121 may provide communication channels between the components in the memory controller 120. The host interface 122 may receive various requests from the external host device and may parse the received requests. The host interface 122 may store the parsed requests in the internal buffer 123.

The host interface 122 may send various responses to the external host device. The host interface 122 may exchange signals with the external host device in compliance with a given communication protocol. The internal buffer 123 may include a random access memory. For example, the internal buffer 123 may include a static random access memory or a dynamic random access memory.

The processor 124 may drive an operating system or firmware for an operation of the memory controller 120. The processor 124 may read the parsed requests stored in the internal buffer 123 and may generate command and addresses for controlling the nonvolatile memory device 110. The processor 124 may provide the generated command and addresses to the memory manager 126.

The processor 124 may store various metadata for managing the storage device 100 in the internal buffer 123. The processor 124 may access the external buffer 130 through the buffer controller 125. The processor 124 may control the buffer controller 125 and the memory manager 126 such that the user data stored in the external buffer 130 are provided to the nonvolatile memory device 110.

The processor 124 may control the host interface 122 and the buffer controller 125 such that the data stored in the external buffer 130 are provided to the external host device. The processor 124 may control the buffer controller 125 and the memory manager 126 such that the data received from the nonvolatile memory device 110 are stored in the external buffer 130. The processor 124 may control the host interface 122 and the buffer controller 125 such that the data received from the external host device are stored in the external buffer 130.

Under control of the processor 124, the buffer controller 125 may write data in the external buffer 130 or may read data from the external buffer 130. The memory manager 126 may communicate with the nonvolatile memory device 110 through the first signal lines SIGL1 and the second signal lines SIGL2 under control of the processor 124.

The memory manager 126 may access the nonvolatile memory device 110 under control of the processor 124. For example, the memory manager 126 may access the nonvolatile memory device 110 through the first signal lines SIGL1 and the second signal lines SIGL2. The memory manager 126 may communicate with the nonvolatile memory device 110, based on a protocol that is defined in compliance with the standard or is defined by a manufacturer.

The error correction code block 127 may perform error correction encoding on data to be transmitted to the nonvolatile memory device 110 by using an error correction code ECC. The error correction code block 127 may perform error correction decoding on data received from the nonvolatile memory device 110 by using the error correction code ECC.

In an example embodiment, the storage device 100 may not include the external buffer 130 and the buffer controller 125. When the external buffer 130 and the buffer controller 125 are not included in the storage device 100, the above functions of the external buffer 130 and the buffer controller 125 may be performed by the internal buffer 123.

Figure 2:
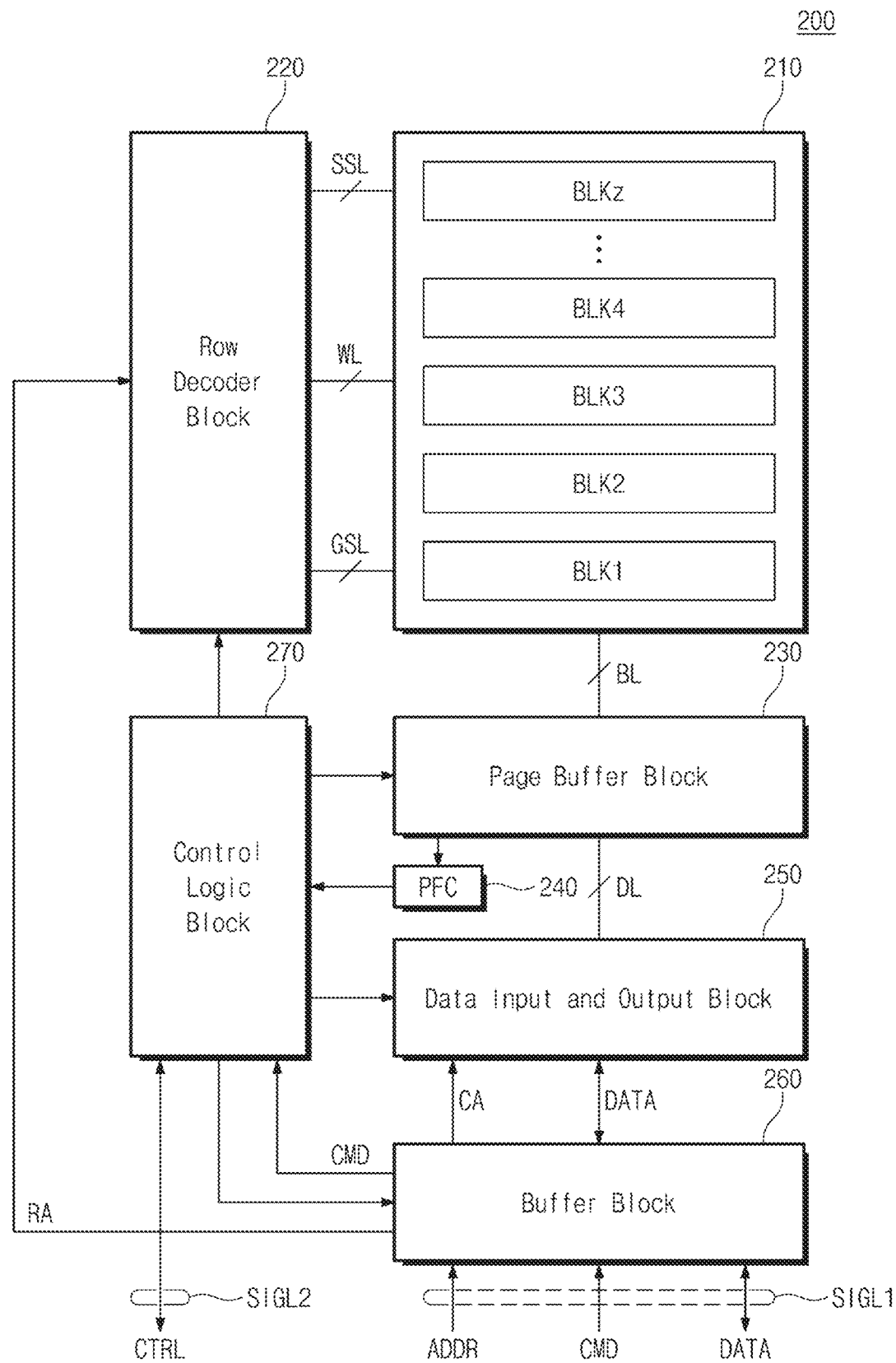
FIG. 2 is a block diagram illustrating a nonvolatile memory device according to an example embodiment of the present disclosure.

FIG. 2 is a block diagram illustrating a nonvolatile memory device 200 according to an example embodiment of the present disclosure. Referring to FIG. 2, the nonvolatile memory device 200 includes a memory cell array 210, a row decoder block 220, a page buffer block 230, a pass/fail check block (PFC) 240, a data input and output block 250, a buffer block 260, and a control logic block 270. The term "block" may be used to express the components of the nonvolatile memory device 200, but the "block" may include a circuit implemented with hardware or may include a circuit implemented with hardware and software or firmware driven on the circuit.

The memory cell array 210 includes a plurality of memory blocks BLK1 to BLKz. Each of the memory blocks BLK1 to BLKz includes a plurality of memory cells. Each of the memory blocks BLK1 to BLKz may be connected with the row decoder block 220 through at least one ground selection line GSL, word lines WL, and at least one string selection line SSL. Some of the word lines WL may be used as dummy word lines. Each of the memory blocks BLK1 to BLKz may be connected with the page buffer block 230 through a plurality of bit lines BL. The plurality of memory blocks BLK1 to BLKz may be connected in common with the plurality of bit lines BL.

In an example embodiment, each of the memory blocks BLK1 to BLKz may be a unit of an erase operation. Memory cells belonging to each of the memory blocks BLK1 to BLKz may be erased at the same time. As another example, each of the memory blocks BLK1 to BLKz may be divided into a plurality of sub-blocks. Each of the plurality of sub-blocks may correspond to a unit of the erase operation.

The row decoder block 220 is connected with the memory cell array 210 through the ground selection lines GSL, the word lines WL, and the string selection lines SSL. The row decoder block 220 operates under control of the control logic block 270 (e.g., the row recorder block receives commands from the control logic block 270 and operates based on the received commands).

The row decoder block 220 may decode a row address RA received from the buffer block 260 and may control voltages to be applied to the string selection lines SSL, the word lines WL, and the ground selection lines GSL based on the decoded row address.

The page buffer block 230 is connected with the memory cell array 210 through the plurality of bit lines BL. The page buffer block 230 is connected with the data input and output block 250 through a plurality of data lines DL. The page buffer block 230 operates under control of the control logic block 270.

In a program operation, the page buffer block 230 may store data to be written in memory cells (e.g., the page buffer block 230 may temporarily store data until it is written in the memory cells). The page buffer block 230 may apply voltages to the plurality of bit lines BL based on the stored data. In a read operation or in a verify read operation that is performed in the program operation or the erase operation, the page buffer block 230 may sense voltages of the bit lines BL and may store a sensing result.

In the verify read operation associated with the program operation or the erase operation, the pass/fail check block 240 may verify the sensing result of the page buffer block 230. For example, in the verify read operation associated with the program operation, the pass/fail check block 240 may count the number of values (e.g., the number of 0s) respectively corresponding to on-cells that are not programmed to a target threshold voltage or more.

In the verify read operation associated with the erase operation, the pass/fail check block 240 may count the number of values (e.g., the number of 1s) respectively corresponding to off-cells that are not erased to a target threshold voltage or less. When a counting result is greater than or equal to a threshold value, the pass/fail check block 240 may output a signal indicating a fail to the control logic block 270. When the counting result is smaller than the threshold value, the pass/fail check block 240 may output a signal indicating a pass to the control logic block 270. Depending on a verification result of the pass/fail check block 240, a program loop of the program operation may be further performed, or an erase loop of the erase operation may be further performed.

The data input and output block 250 is connected with the page buffer block 230 through the plurality of data lines DL. The data input and output block 250 may receive a column address CA from the buffer block 260. The data input and output block 250 may output the data read by the page buffer block 230 to the buffer block 260 depending on the column address CA. The data input and output block 250 may provide the data received from the buffer block 260 to the page buffer block 230, based on the column address CA.

Through the first signal lines SIGL1, the buffer block 260 may receive a command CMD and an address ADDR from an external device and may exchange data "DATA" with the external device. The buffer block 260 may operate under control of the control logic block 270. The buffer block 260 may provide the command CMD to the control logic block 270. The buffer block 260 may provide the row address RA of the address ADDR to the row decoder block 220 and may provide the column address CA of the address ADDR to the data input and output block 250. The buffer block 260 may exchange the data "DATA" with the data input and output block 250.

The control logic block 270 may exchange a control signal CTRL with the external device through the second signal lines SIGL2. The control logic block 270 may allow the buffer block 260 to route the command CMD, the address ADDR, and the data "DATA". The control logic block 270 may decode the command CMD received from the buffer block 260 and may control the nonvolatile memory device 200 based on the decoded command.

In an example embodiment, the nonvolatile memory device 200 may be manufactured in a bonding manner. The memory cell array 210 may be manufactured at a first wafer, and the row decoder block 220, the page buffer block 230, the data input and output block 250, the buffer block 260, and the control logic block 270 may be manufactured at a second wafer. The nonvolatile memory device 200 may be implemented by coupling the first wafer and the second wafer such that an upper surface of the first wafer and an upper surface of the second wafer face each other.

For another example, the nonvolatile memory device 200 may be manufactured in a cell over peri (COP) manner A peripheral circuit including the row decoder block 220, the page buffer block 230, the data input and output block 250, the buffer block 260, and the control logic block 270 may be implemented on a substrate. The memory cell array 210 may be implemented over the peripheral circuit. The peripheral circuit and the memory cell array 210 may be connected by using through vias.

Figure 3:
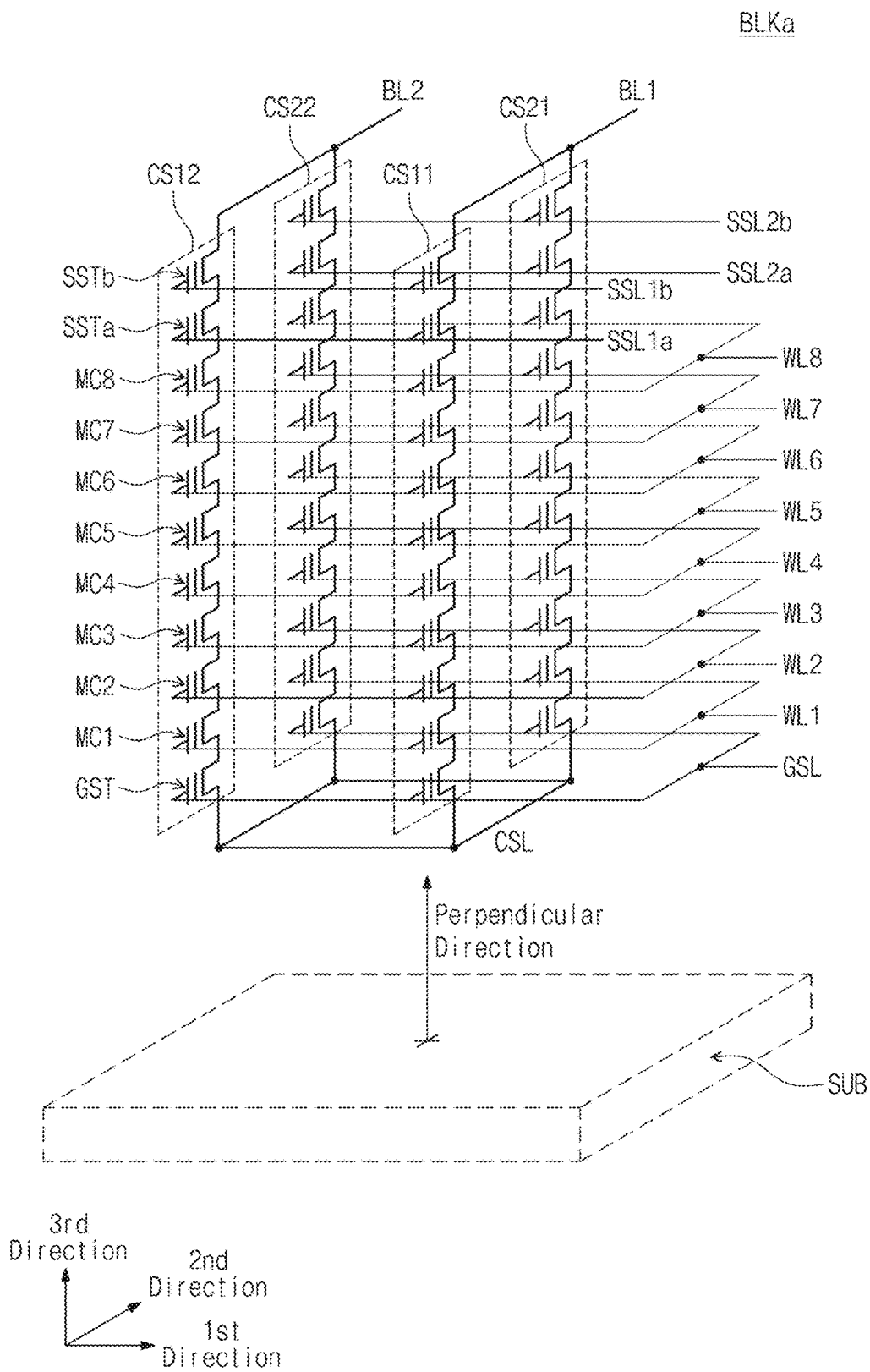
FIG. 3 is a circuit diagram illustrating an example of one memory block of memory blocks of FIG. 2.

FIG. 3 is a circuit diagram illustrating an example of one memory block BLKa of the memory blocks BLK1 to BLKz of FIG. 2. Referring to FIG. 3, a plurality of cell strings CS11, CS12, CS21, and CS22 may be arranged on a substrate SUB in rows and columns. Each row may extend in a first direction. Each column may extend in a second direction. The second direction may be perpendicular to the first direction. The plurality of cell strings CS11, CS12, CS21, and CS22 may be connected in common with a common source line CSL formed on (or in) the substrate SUB. In FIG. 3, a location of the substrate SUB is depicted as an example for better understanding of the structure of the memory block BLKa.

Cell strings of each row may be connected in common with the ground selection line GSL and may be connected with corresponding string selection lines of first and string selection lines SSL1a and SSL1b and second string selection lines SSL2a to SSL2b. Cell strings of each column may be connected with a corresponding bit line of first and second bit lines BL1 and BL2.

Each cell string may include at least one ground selection transistor GST connected with the ground selection line GSL, and a plurality of memory cells MC1 to MC8 respectively connected with a plurality of word lines WL1 to WL8. Cell strings of a first row may further include string selection transistors SSTa and SSTb connected with the first string selection lines SSL1a and SSL1b. Cell strings of a second row may further include string selection transistors SSTa and SSTb connected with the second string selection lines SSL2a and SSL2b.

In each cell string, the ground selection transistor GST, the memory cells MC1 to MC8, and the string selection transistors SSTa and SSTb may be connected in series in a direction perpendicular to the substrate SUB, for example, a third direction and may be stacked, for example sequentially stacked, in the direction perpendicular to the substrate SUB. the third direction may be perpendicular to the first and second directions. In each of the cell strings CS11, CS12, CS21, and CS22, at least one of the memory cells MC1 to MC8 may be used as a dummy memory cell. The dummy memory cell may not be programmed (e.g., may be program-inhibited) or may be programmed differently from the remaining memory cells of the memory cells MC1 to MC8 other than the dummy memory cell.

In an example embodiment, memory cells that are placed at the same height and are associated with one string selection line SSL1a, SSL1b, SSL2a, or SSL2b may form one physical page. Memory cells of one physical page may be connected with one sub word line. Sub-word lines of physical pages located at the same height may be connected in common with one word line. Below the term "word line" may be used to indicate a word line or a sub-word line and may be interpreted based on the context.

An example embodiment in which the memory block BLKa includes the cell strings CS11, CS12, CS21, and CS22 at intersections of a first row corresponding to the first string selection lines, a second row corresponding to the second string selection lines, a first column corresponding to the first bit line BL, and a second column corresponding to the second bit line BL2 is illustrated, but rows and columns of cell strings included in the memory block BLKa are not limited in number.

Figure 4:
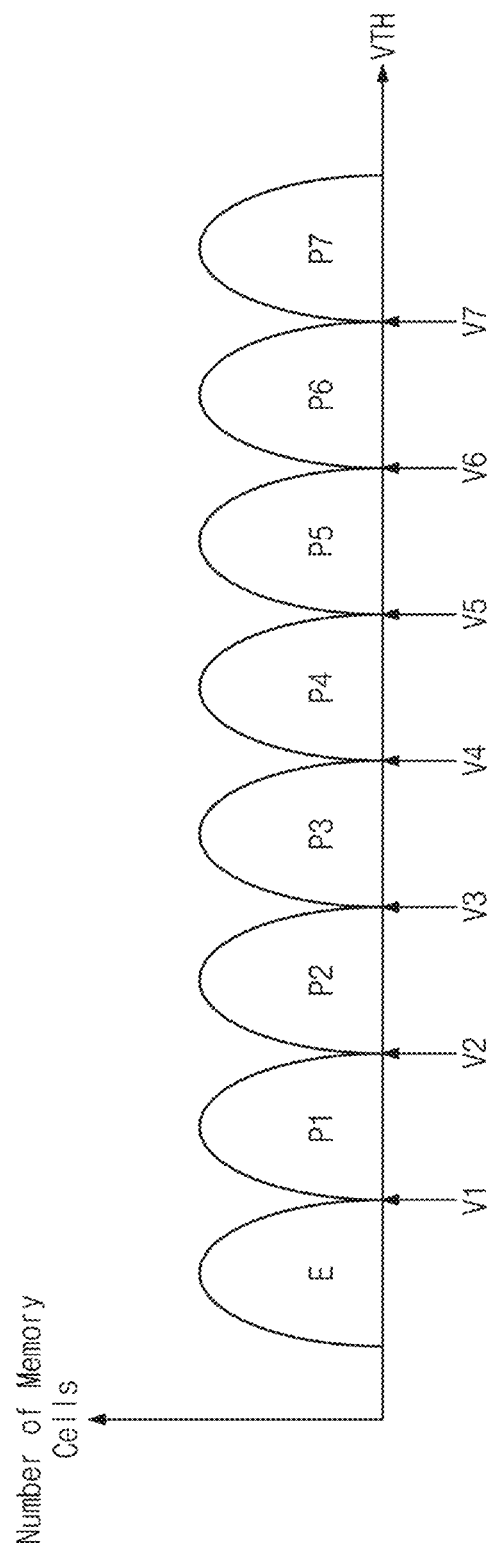
FIG. 4 is a diagram illustrating an example of threshold voltages of memory cells.

FIG. 4 is a diagram illustrating an example of threshold voltages of memory cells MC. In FIG. 4, a horizontal axis represents a threshold voltage VTH of the memory cells MC, and a vertical axis represents the number of memory cells MC. Referring to FIGS. 1, 2, 3, and 4, in response to a write command from the memory controller 120, the nonvolatile memory device 110 or 200 may perform the write operation such that each of the memory cells MC selected for the write operation (e.g., selected by the address ADDR) has a threshold voltage corresponding to one of an erase state "E", a first program state P1, a second program state P2, a third program state P3, a fourth program state P4, a fifth program state P5, a sixth program state P6, and a seventh program state P7.

In response to a read command from the memory controller 120, the nonvolatile memory device 110 or 200 may perform the read operation to identify states of threshold voltages of the memory cells MC selected for the read operation (e.g., selected by the address ADDR) by using a first voltage V1, a second voltage V2, a third voltage V3, a fourth voltage V4, a fifth voltage V5, a sixth voltage V6, and a seventh voltage V7.

The data that the memory controller 120 reads from the nonvolatile memory device 110 or 200 may include an error. For example, in the write operation, there may occur an error that the threshold voltages of the memory cells MC are programmed to be higher or lower than a voltage range of a target state. In the read operation, there may occur an error that the threshold voltages of the memory cells MC have a state different from the target state. Also, there may occur the following error: after the memory cells MC are programmed to have threshold voltages within a threshold voltage range of the target state, the threshold voltages of the memory cells MC may increase or decrease.

To correct the above errors, the memory controller 120 may use the error correction code block 127. The error correction code block 127 may include a circuit implemented with hardware or may include a circuit implemented with hardware and software or firmware driven on the circuit. The memory controller 120 may attempt to correct the error of the read data by performing error correction decoding by using the error correction code block 127. When the error correction performed by the error correction code block 127 fails, the memory controller 120 may perform subsequent operations for error correction depending on a given error correction policy.

The memory controller 120 of the storage device 100 according to an example embodiment of the present disclosure may perform error correction with an improved speed by adaptively determining a procedure of the error correction operation instead of performing the error correction operation depending on a given procedure.

Figure 5:
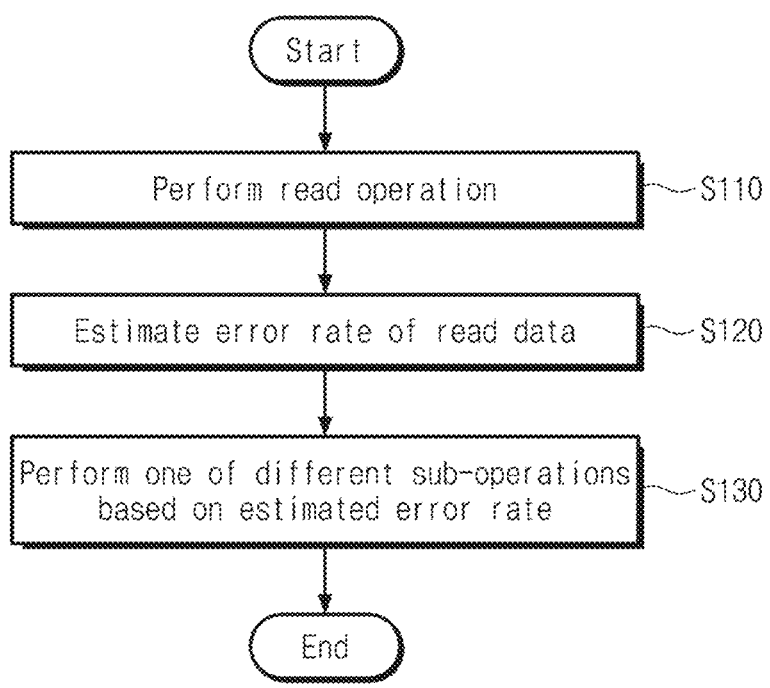
FIG. 5 is a diagram illustrating an example of an operating method of a storage device according to an example embodiment of the present disclosure.

FIG. 5 illustrates an example of an operating method of the storage device 100 according to an example embodiment of the present disclosure. Referring to FIGS. 1, 2, 3, 4, and 5, in operation S110, the storage device 100 may perform the read operation. For example, the memory controller 120 may send a read command to the nonvolatile memory device 110 or 200. The nonvolatile memory device 110 or 200 may perform the read operation in response to the read command. The read operation may be performed by using default read voltages or by using read voltages determined based on a read history (e.g., including read voltages of at least one previous read operation). The nonvolatile memory device 110 or 200 may send the read data to the memory controller 120.

In operation S120, the memory controller 120 of the storage device 100 may estimate an error rate of the read data. In operation S130, the memory controller 120 of the storage device 100 may select and perform one of different sub-operations of the error correction operation based on the estimated error rate.

Error correction decoding on the read data uses time and consumes power and thus may lead to delays in further operations with the read data and may increase power consumption of the storage device 100. The memory controller 120 of the storage device 100 according to an example embodiment of the present disclosure may estimate the error rate before the error correction decoding. The memory controller 120 may determine whether to perform or omit the error correction decoding, based on the estimated error rate.

For example, when the memory controller 120 determines that the error correction decoding will fail, the memory controller 120 may reduce the time and power consumption of the error correction decoding by omitting the error correction decoding. When the memory controller 120 determines that the error correction decoding will succeed, the memory controller 120 may quickly obtain the error-corrected data by performing the error correction decoding. That is, the storage device 100 according to an example embodiment of the present disclosure may improve a speed at which the error correction operation is performed, by adaptively adjusting and performing the procedure of the error correction operation.

Figure 6:
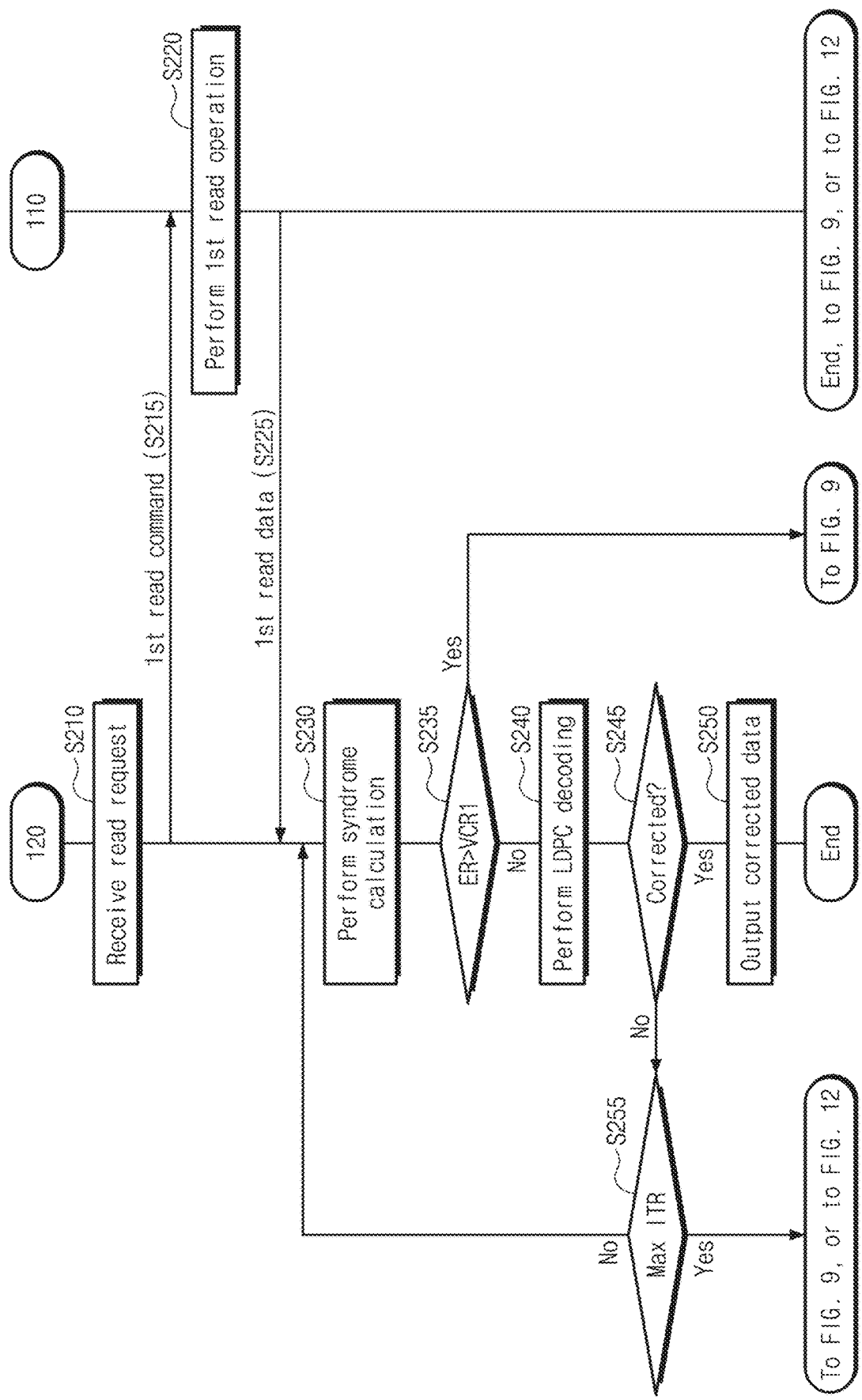
FIG. 6 is a diagram illustrating an example of a first error correction operation.

FIG. 6 is a diagram illustrating an example of a first error correction operation. Referring to FIGS. 1 and 6, in operation S210, the memory controller 120 may receive the read request from the external host device. In response to the read request, in operation S215, the memory controller 120 may send a first read command to the nonvolatile memory device 110.

In response to the first read command, in operation S220, the nonvolatile memory device 110 may perform a first read operation. In an example embodiment, as described with reference to FIG. 4, the nonvolatile memory device 110 may perform the read operation by using one read voltage between two adjacent states. The read voltage may be a default read voltage or a read voltage that is determined based on a read history. In operation S225, the nonvolatile memory device 110 may send first read data to the memory controller 120.

In operation S230, the memory controller 120 may perform syndrome calculation. For example, the memory controller 120 may calculate a syndrome vector (e.g., a one-dimensional matrix) by multiplying the first read data and a parity check matrix together. The syndrome vector may include a value of "0" or "1". The memory controller 120 may estimate the ratio of "1" in the syndrome vector as an error rate ER.

In operation S235, the memory controller 120 may determine whether the estimated error rate ER is greater than a first threshold value VCR1. In an example embodiment, the first threshold value VCR1 may be input to the memory controller 120 in the process of manufacturing the storage device 100 or may be set and adjusted by the external host device.

Figure 9:
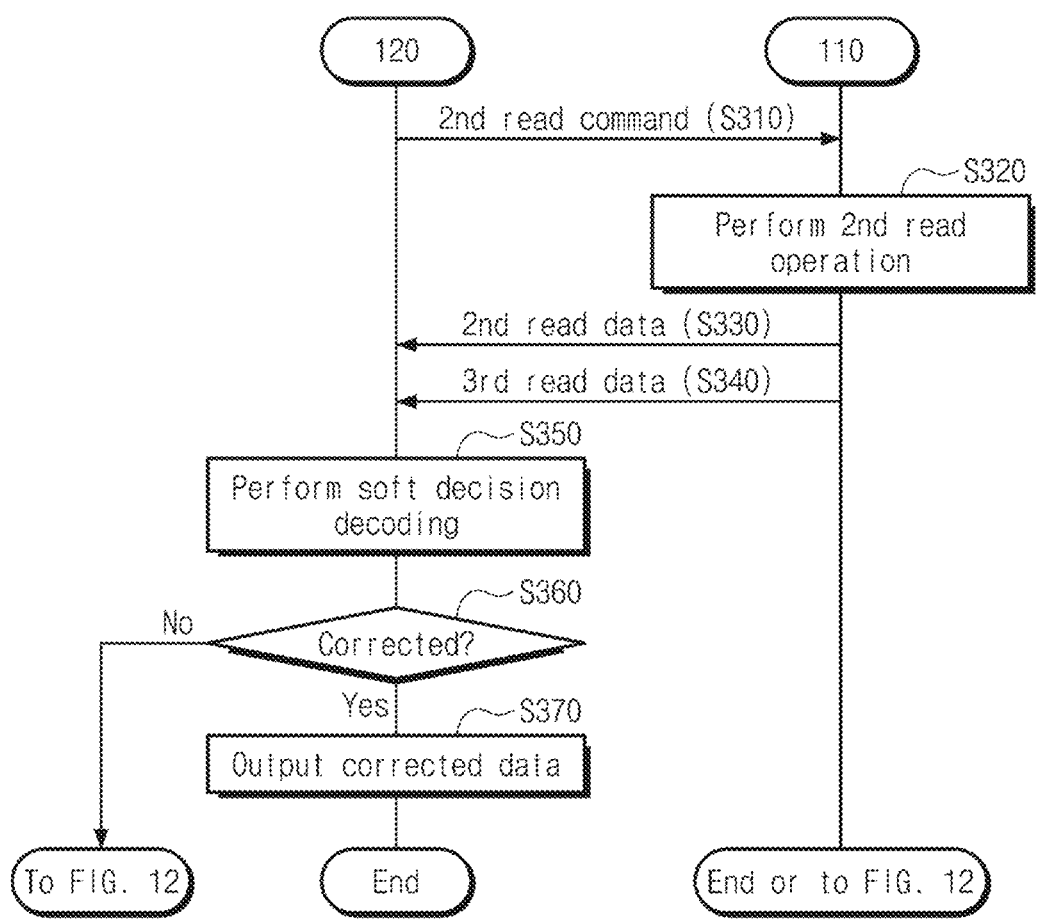
FIG. 9 is a diagram illustrating an example of a second error correction operation.

When the estimated error rate ER is greater than the first threshold value VCR1, the memory controller 120 may omit the error correction decoding and may perform a second error correction operation of FIG. 9. When the estimated error rate ER is not greater than the first threshold value VCR1, that is, when the estimated error rate ER is equal to or smaller than the first threshold value VCR1, in operation S240, the memory controller 120 may perform LDPC (Low Density Parity Check) decoding. In an example embodiment, the LDPC decoding in operation S240 may be hard decision decoding.

In operation S245, the memory controller 120 may determine whether an error of the first read data is corrected. When the memory controller 120 determines that the error of the first read data is corrected, in operation S250, the memory controller 120 may output the error-corrected first read data to the external host device. Afterwards, the read operation and the error correction operation according to the read request in operation S210 may end.

When the memory controller 120 determines that the error of the first read data is not corrected, in operation S255, the memory controller 120 may determine whether the hard decision decoding is performed as much as the maximum (or alternatively, threshold) number of times of iteration ITR. For example, the maximum (or alternatively, threshold) number of times of iteration ITR may be a positive integer of 1 or more. When the memory controller 120 determines that the hard decision decoding is performed as much as the maximum (or alternatively, threshold) number of times of iteration ITR, the memory controller 120 may determine that the hard decision decoding fails. When the hard decision decoding fails, the memory controller 120 may perform the second error correction operation of FIG. 9 or a third error correction operation of FIG. 13.

Figure 13:
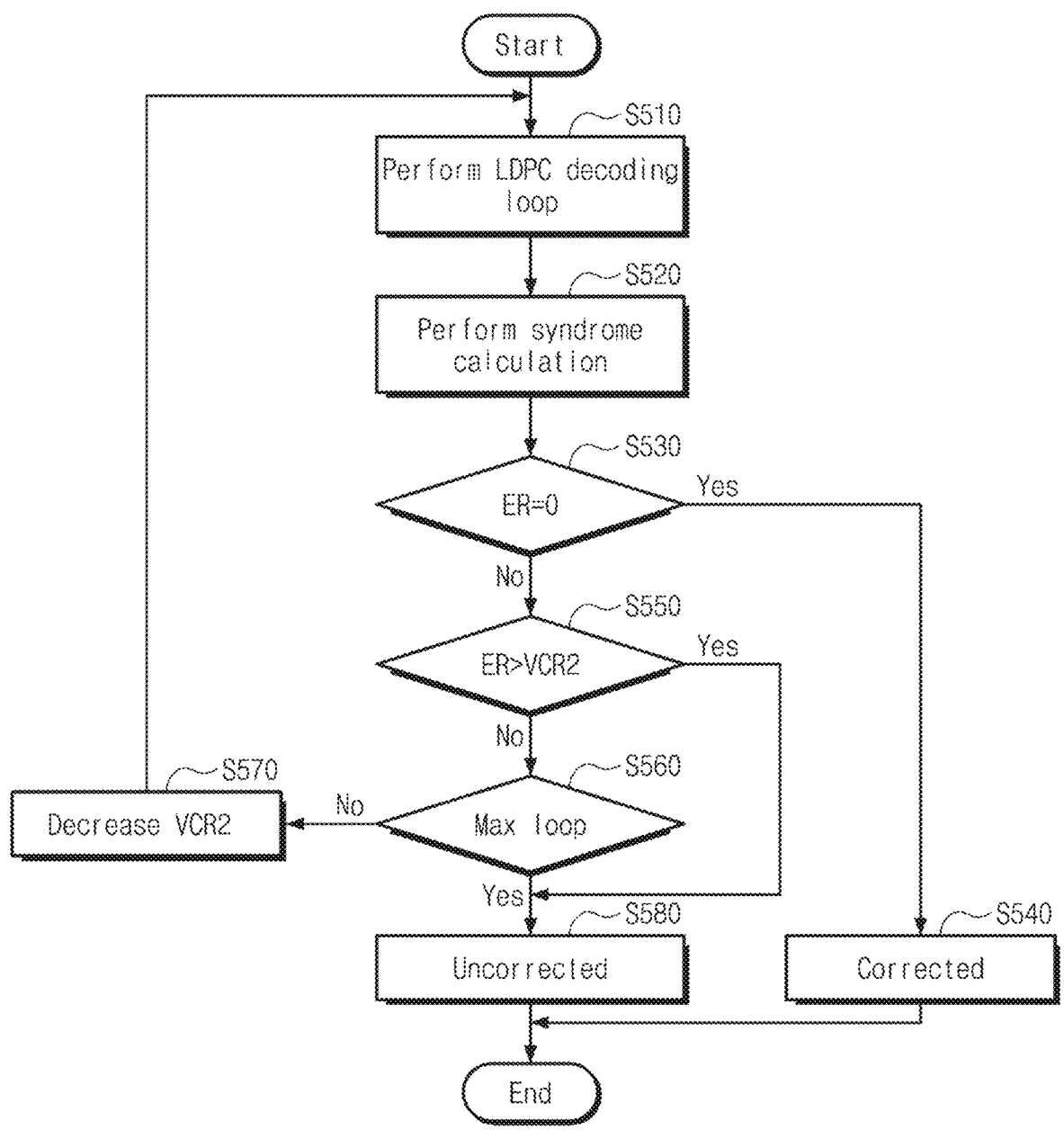
FIG. 13 is a diagram illustrating an example in which a storage device estimates an error rate within loops of error correction decoding and adaptively ends the loops of the error correction decoding depending on an estimated error rate.

The memory controller 120 may be implemented to perform the second error correction operation of FIG. 9 or the third error correction operation of FIG. 13 when the hard decision decoding fails. The memory controller 120 may be implemented to perform the second error correction operation of FIG. 9 and the third error correction operation of FIG. 13 when the hard decision decoding fails. Hard decision decoding, which will be performed by the memory controller 120 when the hard decision decoding fails, from among the second error correction operation of FIG. 9 and the third error correction operation of FIG. 13 may be set by the external host device.

When the memory controller 120 determines that the hard decision decoding is not performed as much as the maximum (or alternatively, threshold) number of times of iteration ITR, the memory controller 120 may again perform operation S230. As another example, the memory controller 120 may again return to operation S240. The memory controller 120 may perform the LDPC decoding in a state of fixing or adjusting a decoding parameter of the LDPC decoding. The decoding parameter may include parameters or initial likelihood values that are used to generate a C2V message at a check node or to generate a V2C message at a variable node.

As another example, the memory controller 120 may again return to operation S215. The memory controller 120 may again send the first read command including information of levels of read voltages to the nonvolatile memory device 110 such that the nonvolatile memory device 110 changes levels of read voltages to perform the read operation.

As another example, the memory controller 120 may send a command to the nonvolatile memory device 110 such that the nonvolatile memory device 110 performs a valley search operation to detect voltage levels of valleys. The memory controller 120 may receive the valley voltage levels from the nonvolatile memory device 110. The memory controller 120 may again send the first read command including information of levels of read voltages corresponding to the valley voltage levels to the nonvolatile memory device 110.

Figure 7:
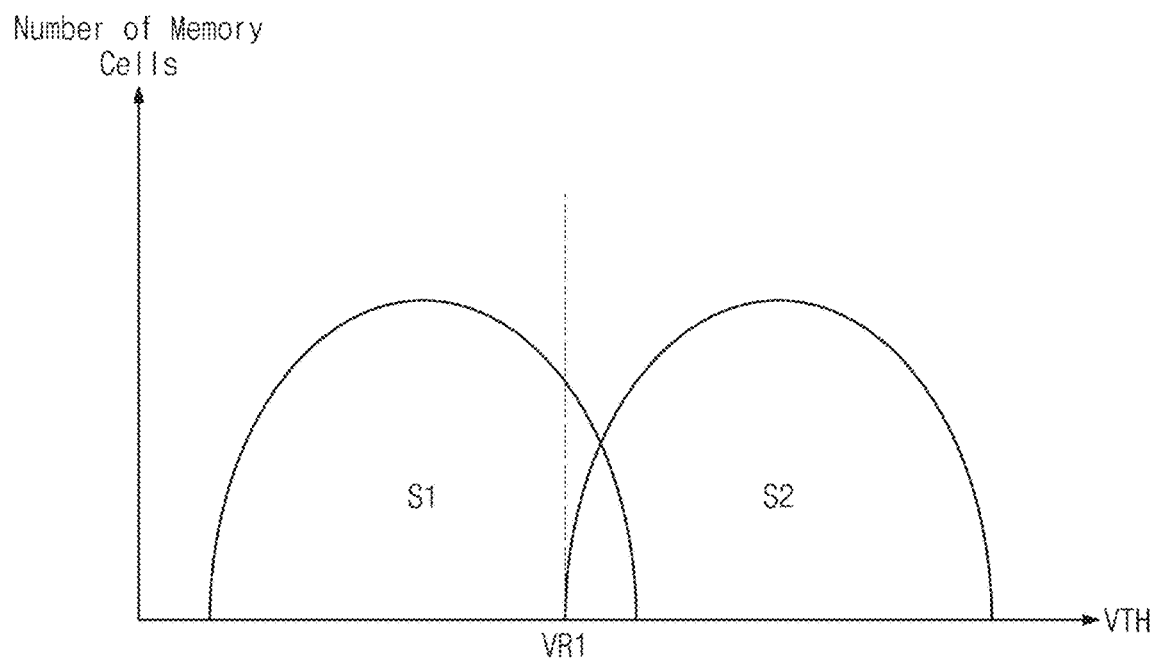
FIG. 7 is a diagram illustrating an example of a read voltage.

FIG. 7 is a diagram illustrating an example of a read voltage. In FIG. 7, a horizontal axis represents threshold voltages Vth of memory cells, and a vertical axis represents the number of memory cells. A first state S1 may be one of the erase state "E", the first program state P1, the second program state P2, the third program state P3, the fourth program state P4, the fifth program state P5, and the sixth program state P6 of FIG. 4. A second state S2 may be adjacent to the first state S1, may have a higher threshold voltage range than the first state S1, and may be one of the first program state P1, the second program state P2, the third program state P3, the fourth program state P4, the fifth program state P5, the sixth program state P6, and the seventh program state P7.

Referring to FIGS. 1, 2, 6, and 7, the nonvolatile memory device 110 may perform the read operation by a first read voltage VR1 (S220). The hard decision decoding that the memory controller 120 performs on first read data read by using the first read voltage VR1 may fail. When the hard decision decoding fails, the memory controller 120 may perform valley search and may again perform operation S215.

Figure 8:
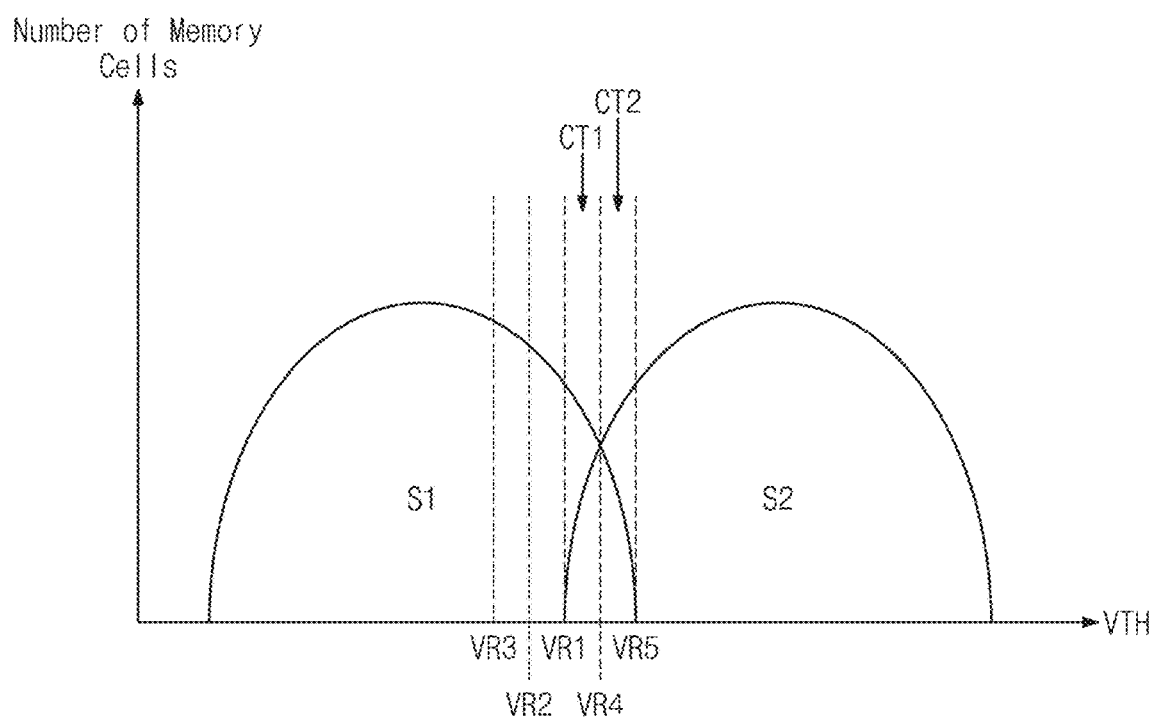
FIG. 8 is a diagram illustrating an example in which a valley search operation is performed.

FIG. 8 is a diagram illustrating an example in which a valley search operation is performed. In FIG. 8, a horizontal axis represents threshold voltages Vth of memory cells, and a vertical axis represents the number of memory cells. Referring to FIGS. 1, 2, 6, and 8, the nonvolatile memory device 110 may perform the read operation by using a second read voltage VR2 and a third read voltage VR3 lower than the first read voltage VR1 and a fourth read voltage VR4 and a fifth read voltage VR5 higher than the first read voltage VR1.

The nonvolatile memory device 110 may count the number of memory cells whose threshold voltages are between adjacent read voltages. For example, the nonvolatile memory device 110 may count the number of memory cells whose threshold voltages are between the third read voltage VR3 and the second read voltage VR2, the number of memory cells whose threshold voltages are between the second read voltage VR2 and the first read voltage VR1, the number of memory cells whose threshold voltages are between the first read voltage VR1 and the fourth read voltage VR4, and the number of memory cells whose threshold voltages are between the fourth read voltage VR4 and the fifth read voltage VR5.

The nonvolatile memory device 110 may determine the fourth read voltage VR as a valley based on changes of count values. The nonvolatile memory device 110 may output information about the level of the fourth read voltage VR4, a first count value CT1 indicating the number of memory cells in a period adjacent to the valley, and a second count value CT2 indicating the number of memory cells in a period adjacent to the valley.

As another example, the nonvolatile memory device 110 may output count values or read results to the memory controller 120. The memory controller 120 may determine the fourth read voltage VR as a valley based on the count values or the read results.

In an example embodiment, the memory controller 120 may determine whether the valley search succeeds, based on the first count value CT1 and the second count value CT2. When the first count value CT1 and the second count value CT2 are greater than a reference value, the memory controller 120 may determine that the valley search fails. When the first count value CT1 and the second count value CT2 are equal to or smaller than the reference value, the memory controller 120 may determine that the valley search succeeds. The reference value may be input to the memory controller 120 in the process of manufacturing the storage device 100 or may be set and adjusted by the external host device. When the valley search fails, the memory controller 120 may again perform the valley search or may perform any other error correction operation.

The valley search described with reference to FIGS. 7 and 8 may be performed in respective periods between the erase state "E" and the first program state P1, between the first program state P1 and the second program state P2, between the second program state P2 and the third program state P3, between the third program state P3 and the fourth program state P4, between the fourth program state P4 and the fifth program state P5, between the fifth program state P5 and the sixth program state P6, and between the sixth program state P6 and the seventh program state P7 or may be performed in at least one of the periods. A read voltage between states that does not experience the valley search may be calculated by adding an offset to a voltage level of a valley between states that experience the valley search.

In an example embodiment, in operation S235 of FIG. 6, when the error rate ER is greater than the first threshold value VCR1, the memory controller 120 may be implemented to perform the valley search instead of performing the second error correction operation of FIG. 9. The memory controller 120 may adjust levels of read voltages through the valley search and may return to operation S210.

In an example embodiment, the memory controller 120 may be implemented to perform operation S210 after performing the valley search. In an example embodiment, when the first error correction operation ends in a state where the valley search is not performed, the valley search may be performed before the second error correction operation or the third error correction operation is performed.

FIG. 9 is a diagram illustrating an example of a second error correction operation. Referring to FIGS. 1 and 9, in operation S310, the memory controller 120 may send a second read command to the nonvolatile memory device 110. The second read command may be different from the first read command. In response to the second read command, in operation S320, the nonvolatile memory device 110 may perform a second read operation. The second read operation may be different to the first read operation.

In the second read operation, the nonvolatile memory device 110 may generate second read data and third read data. The size of each of the second read data and the third read data may be equal to the size of the first read data. In operation S330, the nonvolatile memory device 110 may send the second read data to the memory controller 120. In operation S340, the nonvolatile memory device 110 may send the third read data to the memory controller 120.

In operation S350, the memory controller 120 may perform soft decision decoding (e.g., first soft decision decoding). The memory controller 120 may perform the soft decision decoding based on the first read data, the second read data, and the third read data. Because both the second read data and the third read data for the soft decision decoding are obtained through one read operation (S320), the soft decision decoding in operation S350 may be referred to as "fast soft decision decoding".

In operation S360, the memory controller 120 may determine whether an error of the first read data is corrected. When the memory controller 120 determines that the error of the first read data is corrected, in operation S370, the memory controller 120 may output the error-corrected first read data to the external host device. Afterwards, the read operation and the error correction operation according to the read request in operation S210 may end.

Figure 12:
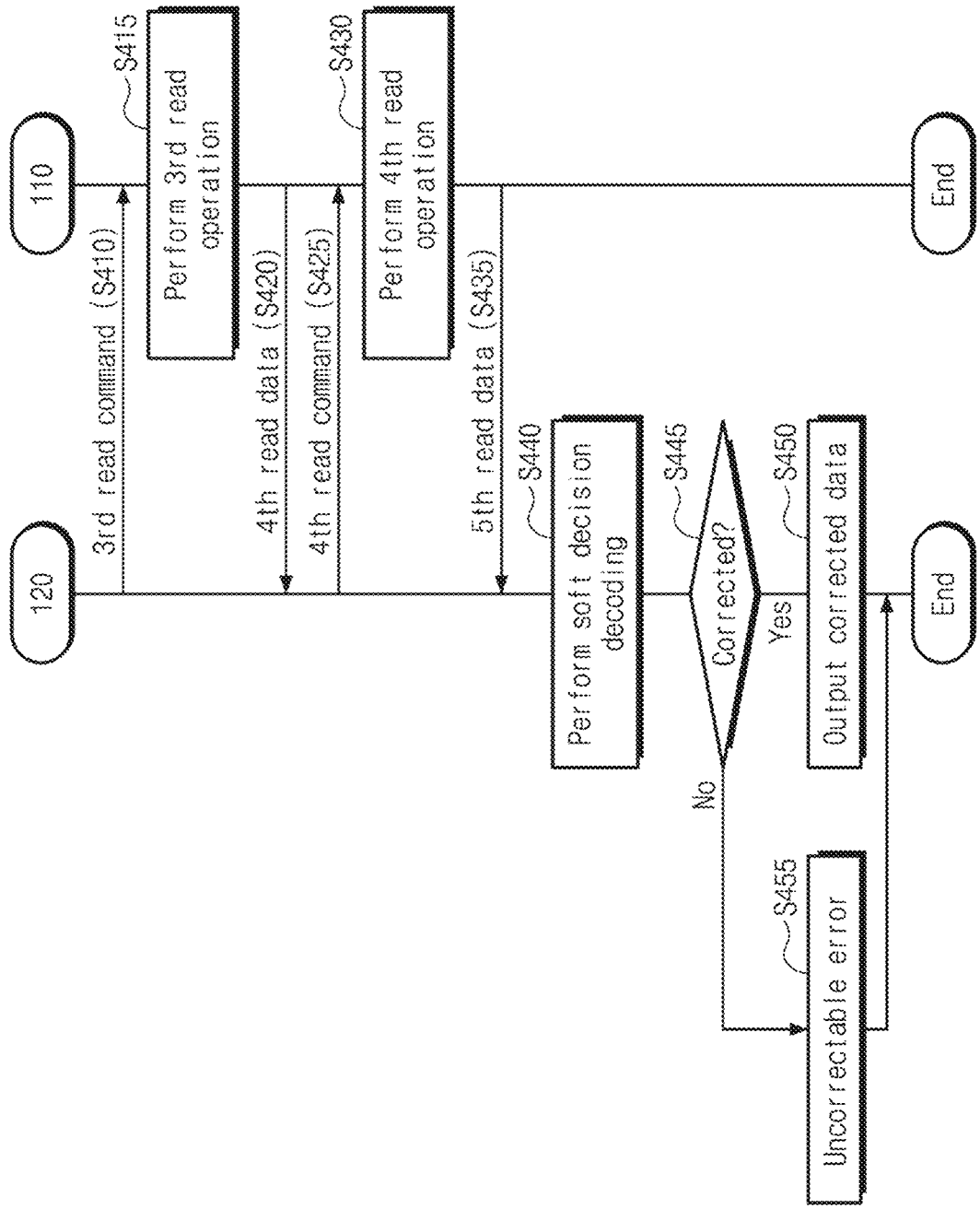
FIG. 12 is a diagram illustrating an example of a third error correction operation.

When the error of the first read data is not corrected, the memory controller 120 may perform the third error correction operation of FIG. 12.

Figure 10:
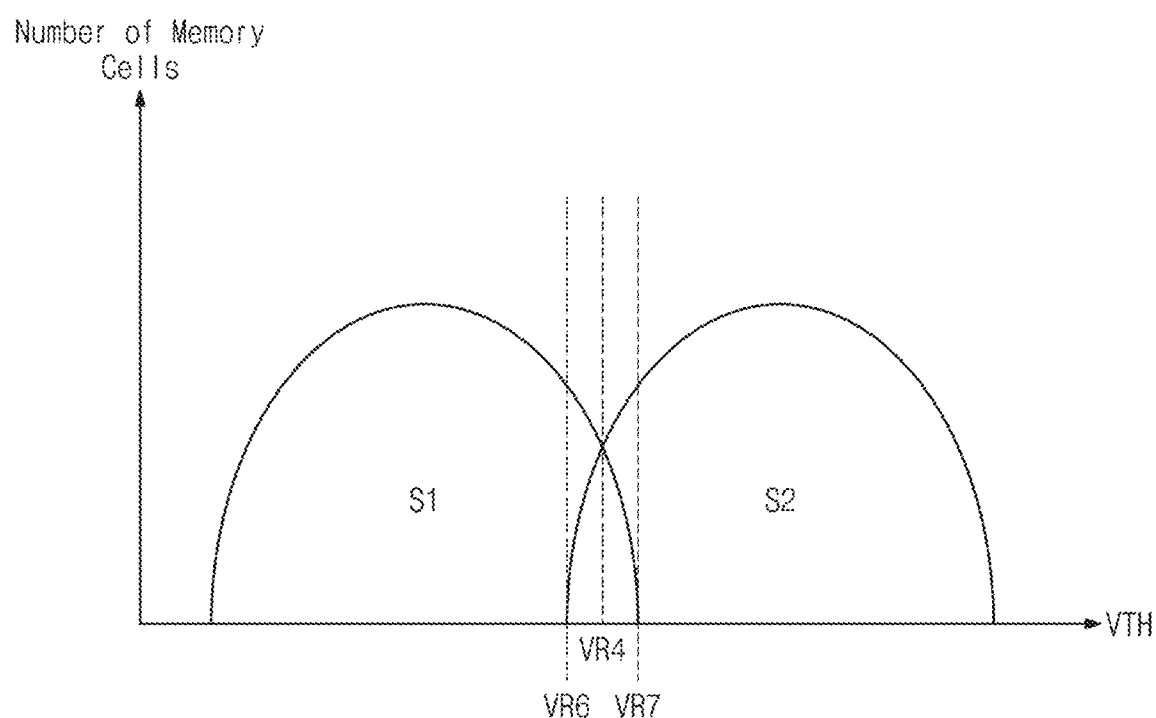
FIG. 10 is a diagram illustrating an example of read voltages necessary for soft decision decoding.

FIG. 10 is a diagram illustrating an example of read voltages necessary for soft decision decoding. In FIG. 10, a horizontal axis represents a threshold voltage VTH of a memory cell, and a vertical axis represents the number of memory cells.

The fourth read voltage VR4 may correspond to a valley. In an example embodiment, the fourth read voltage VR4 may be identified by the valley search described with reference to FIG. 8. Under control of the memory controller 120, the nonvolatile memory device 110 may generate the second read data and the third read data corresponding to results of the read operations that use the sixth read voltage VR6 lower than the fourth read voltage VR4 and the seventh read voltage VR7 higher than the fourth read voltage VR4.

Figure 11:
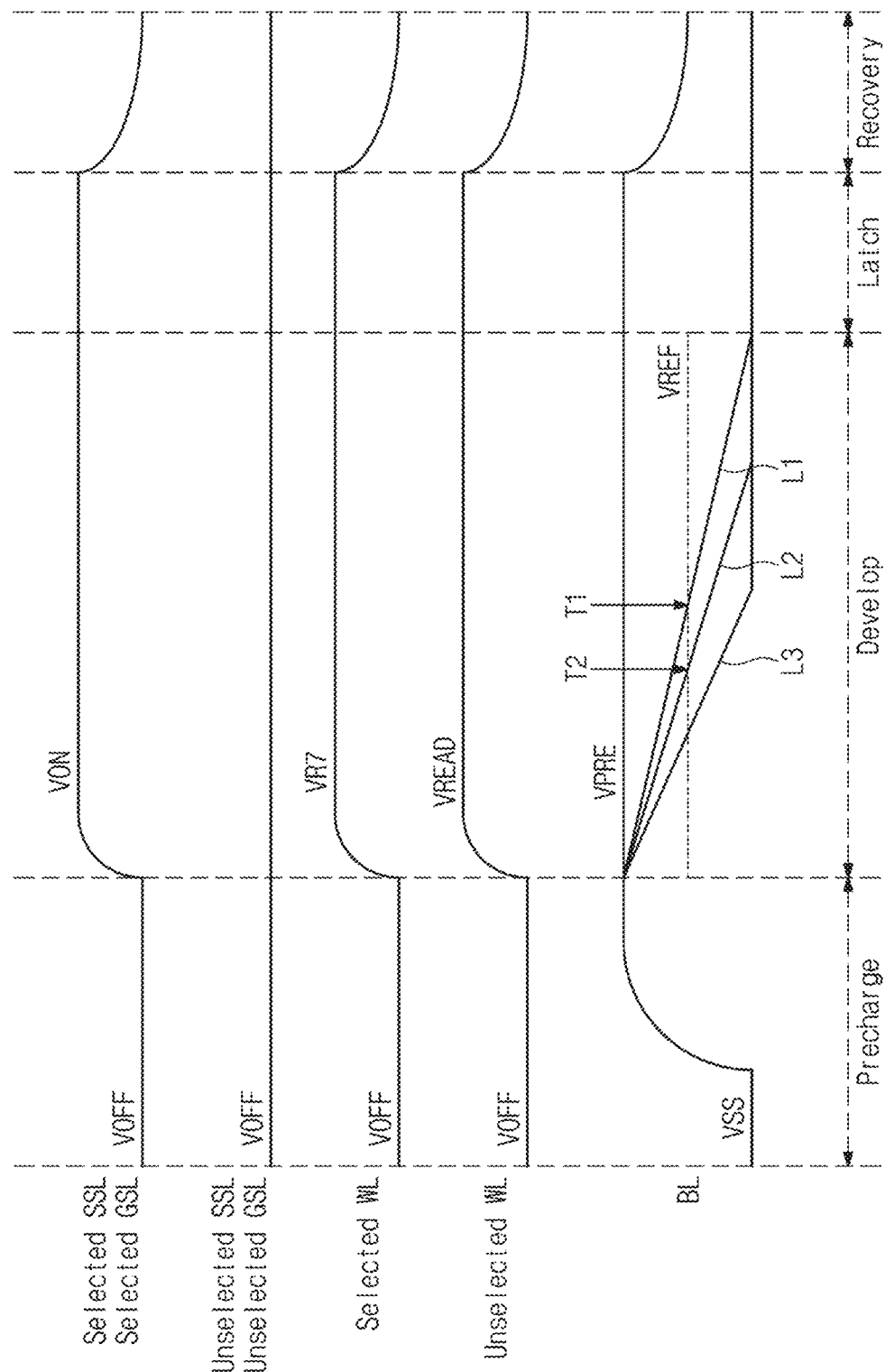
FIG. 11 is a diagram illustrating an example of a process in which a nonvolatile memory device generates a second read voltage and a third read voltage.

FIG. 11 is a diagram illustrating an example of the process in which the nonvolatile memory device 200 generates a second read voltage and a third read voltage. Referring to FIGS. 2, 3, 10, and 11, in a precharge period, the row decoder block 220 may apply a turn-off voltage VOFF to a selected string selection line SSL and a selected ground selection line GSL, may apply the turn-off voltage VOFF to an unselected string selection line SSL and an unselected ground selection line GSL, may apply the turn-off voltage VOFF to a selected word line WL, and may apply the turn-off voltage VOFF to an unselected word line WL.

The turn-off voltage VOFF may turn off relevant string selection transistors SSTa and SSTb, relevant ground selection transistors GST, and relevant memory cells MC1 to MC8. In the precharge period, the page buffer block 230 may apply a precharge voltage VPRE to the bit lines BL after applying a ground voltage VSS to the bit lines BL.

In a develop period, the row decoder block 220 may apply a turn-on voltage VON to the selected string selection lines SSL and the selected ground selection lines GSL. The turn-on voltage VON may turn on relevant string selection transistors SSTa and SSTb and relevant ground selection transistors GST.

In the develop period, the row decoder block 220 may apply the seventh read voltage VR7 to the selected word line WL and may apply a read pass voltage VREAD to the unselected word lines WL. The read pass voltage VREAD may turn on the relevant memory cells MC1 to MC8.

Memory cells each having a threshold voltage higher than the seventh read voltage VR7 from among memory cells connected with a selected word line may be turned off. Accordingly, a voltage of the bit line BL connected with a relevant memory cell from among the bit lines BL may be maintained at the precharge voltage VPRE.

In a latch period, the page buffer block 230 may latch read data (e.g., the second read data or the third read data) corresponding to the seventh read voltage VR7. In a recovery period, the voltages of the string selection lines SSL, the ground selection lines GSL, and the word lines WL, and the bit lines BL may be recovered.

A memory cell (e.g., a ninth memory cell) having a threshold voltage (e.g., a first threshold voltage) slightly lower than the seventh read voltage VR7 from among memory cells connected with a selected word line may be weakly turned on. Accordingly, a voltage of the bit line BL connected with the ninth memory cell from among the bit lines BL may slowly decrease like a first line L1.

The amount of cell current flowing through a memory cell (e.g., a tenth memory cell) having a threshold voltage (e.g., a second threshold voltage) lower than the first threshold voltage from among the memory cells connected with the selected word line may be greater than the amount of cell current flowing through the ninth memory cell having the first threshold voltage. Accordingly, a voltage of the bit line BL connected with the tenth memory cell from among the bit lines BL may decrease relatively quickly like a second line L2, compared to the first line L1.

The amount of cell current flowing through a memory cell (e.g., an eleventh memory cell) having a threshold voltage (e.g., a third threshold voltage) lower than the second threshold voltage from among the memory cells connected with the selected word line may be greater than the amount of cell current flowing through the tenth memory cell having the second threshold voltage. Accordingly, a voltage of the bit line BL connected with the eleventh memory cell from among the bit lines BL may decrease relatively quickly like a third line L3, compared to the second line L2.

In an example embodiment, when the voltage of the bit line BL is lower than a reference voltage VREF, the page buffer block 230 may identify that the memory cell connected with the bit line BL is turned on. When the voltage of the bit line BL is equal to or higher than the reference voltage VREF, the page buffer block 230 may identify that the memory cell connected with the bit line BL is turned off.

In the case of sensing the voltage of the bit line BL after a first time T1, the nonvolatile memory device 200 may identify that all of the ninth memory cell, the tenth memory cell, and the eleventh memory cell are turned on. In the case of sensing the voltage of the bit line BL between the first time T1 and a second time T2, the nonvolatile memory device 200 may identify that the ninth memory cell is turned off and the tenth memory cell and the eleventh memory cell are turned on.

As described above, when the voltage of the bit line BL is sensed before the first time T1, a similar effect occurs as the voltage applied to the selected word line WL is lowered. By adjusting the timing to latch, the page buffer block 230 may generate read data (e.g., the third read data or the second read data) corresponding to data that are read when the sixth read voltage VR6 is applied to the selected word line WL.

FIG. 12 is a diagram illustrating an example of a third error correction operation. Referring to FIGS. 1 and 12, in operation S410, the memory controller 120 may send a third read command to the nonvolatile memory device 110. The third read command may be different from the first read command or the second read command. The third read command may include information about a level of a read voltage (e.g., the sixth read voltage VR6). In response to the third read command, in operation S415, the nonvolatile memory device 110 may perform a third read operation. For example, the nonvolatile memory device 110 may perform the read operation by using the sixth read voltage VR6.

In the third read operation, the nonvolatile memory device 110 may generate fourth read data. In operation S420, the nonvolatile memory device 110 may send the third read data to the memory controller 120.

In operation S425, the memory controller 120 may send a fourth read command to the nonvolatile memory device 110. The fourth read command may be different from the first read command, the second read command, or the third read command. The fourth read command may include information about a level of a read voltage (e.g., the seventh read voltage VR7). In response to the fourth read command, in operation S430, the nonvolatile memory device 110 may perform a fourth read operation. For example, the nonvolatile memory device 110 may perform the read operation by using the seventh read voltage VR7. In the fourth read operation, the nonvolatile memory device 110 may generate fifth read data. In operation S435, the nonvolatile memory device 110 may send the fifth read data to the memory controller 120.

In operation S440, the memory controller 120 may perform soft decision decoding (e.g., second soft decision decoding). The memory controller 120 may perform the soft decision decoding based on the first read data, the fourth read data, and the fifth read data.

In operation S445, the memory controller 120 may determine whether an error of the first read data is corrected. When the memory controller 120 determines that the error of the first read data is corrected, in operation S450, the memory controller 120 may output the error-corrected first read data to the external host device. Afterwards, the read operation and the error correction operation according to the read request in operation S210 may end.

When the error of the first read data is not corrected, the memory controller 120 may end the third error correction operation. Afterwards, the memory controller 120 may notify the external host device that an uncorrectable error occurs. Alternatively, the memory controller 120 may further perform a subsequent error correction operation defined by the error correction policy.

The third error correction operation is performed based on the fourth read data and the fifth read data that are respectively read by using the sixth read voltage VR6 and the seventh read voltage VR7. Accordingly, the reliability of the third error correction operation may be higher than the reliability of the second error correction operation.

As described above, a storage device according to an example embodiment of the present disclosure is configured to perform hard decision decoding or fast soft decision decoding based on an estimated error rate. Accordingly, a time taken for the storage device 100 to perform error correction is shortened.

FIG. 13 is a diagram illustrating an example in which the storage device 100 estimates an error rate within loops of error correction decoding and adaptively ends the loops of the error correction decoding depending on the estimated error rate. Referring to FIGS. 1 and 13, in operation S510, the memory controller 120 may perform an LDPC decoding loop. For example, the LDPC decoding loop may include generating a V2C message to update a check node and generating a C2V message to update a variable node.

In operation S520, the memory controller 120 may perform syndrome calculation. For example, the memory controller 120 may calculate a syndrome vector (e.g., a one-dimensional matrix) by multiplying a result of the LDPC decoding loop and the parity check matrix together. The syndrome vector may include a value of "0" or "1". The memory controller 120 may estimate the ratio of "1" in the syndrome vector as the error rate ER.

In operation S530, the memory controller 120 may determine whether the estimated error rate ER is "0". When the estimated error rate ER is "0", in operation S540, the memory controller 120 may determine that the error is corrected and may end the LDPC decoding.

When the estimated error rate ER is not "0", in operation S550, the memory controller 120 may determine whether the estimated error rate ER is greater than a second threshold value VCR2. The second threshold value VCR2, for example, an initial value of the second threshold value VCR2 may be input to the memory controller 120 in the process of manufacturing the storage device 100 or may be set and adjusted by the external host device.

When the estimated error rate ER is greater than the second threshold value VCR2, in operation S580, the memory controller 120 may determine that the error is not corrected and may end the LDPC decoding. When the estimated error rate ER is not greater than the second threshold value VCR2, that is, when the estimated error rate ER is equal to or smaller than the second threshold value VCR2, in operation S560, the memory controller 120 may determine whether an LDPC decoding loop is a max loop.

When the memory controller 120 determines that the LDPC decoding loop is the max loop, in operation S580, the memory controller 120 may determine that the error is not corrected and may end the LDPC decoding. When the memory controller 120 determines that the LDPC decoding loop is not the max loop, in operation S570, the memory controller 120 may decrease the second threshold value VCR2. Afterwards, the memory controller 120 may return to operation S510.

In an example embodiment, when the LDPC decoding loops are correctly performed, as the LDPC decoding loop is iterated, the reliability of a result of the LDPC decoding loop may increase, and the error rate may decrease. By decreasing the second threshold value VCR2 as the LDPC decoding loop is iterated, whether the LDPC decoding loop is not correctly performed in a state of failing to decrease the error rate may be determined.

In an example embodiment, the operations of estimating the error rate ER and comparing the estimated error rate ER and the second threshold value VCR2 may be performed at a period composed of two or more LDPC decoding loops. The operation of decreasing the second threshold value VCR2 may be performed at a period composed of two or more LDPC decoding loops or at a period composed of two or more operations of comparing the estimated error rate ER and the second threshold value VCR2.

Figure 14:
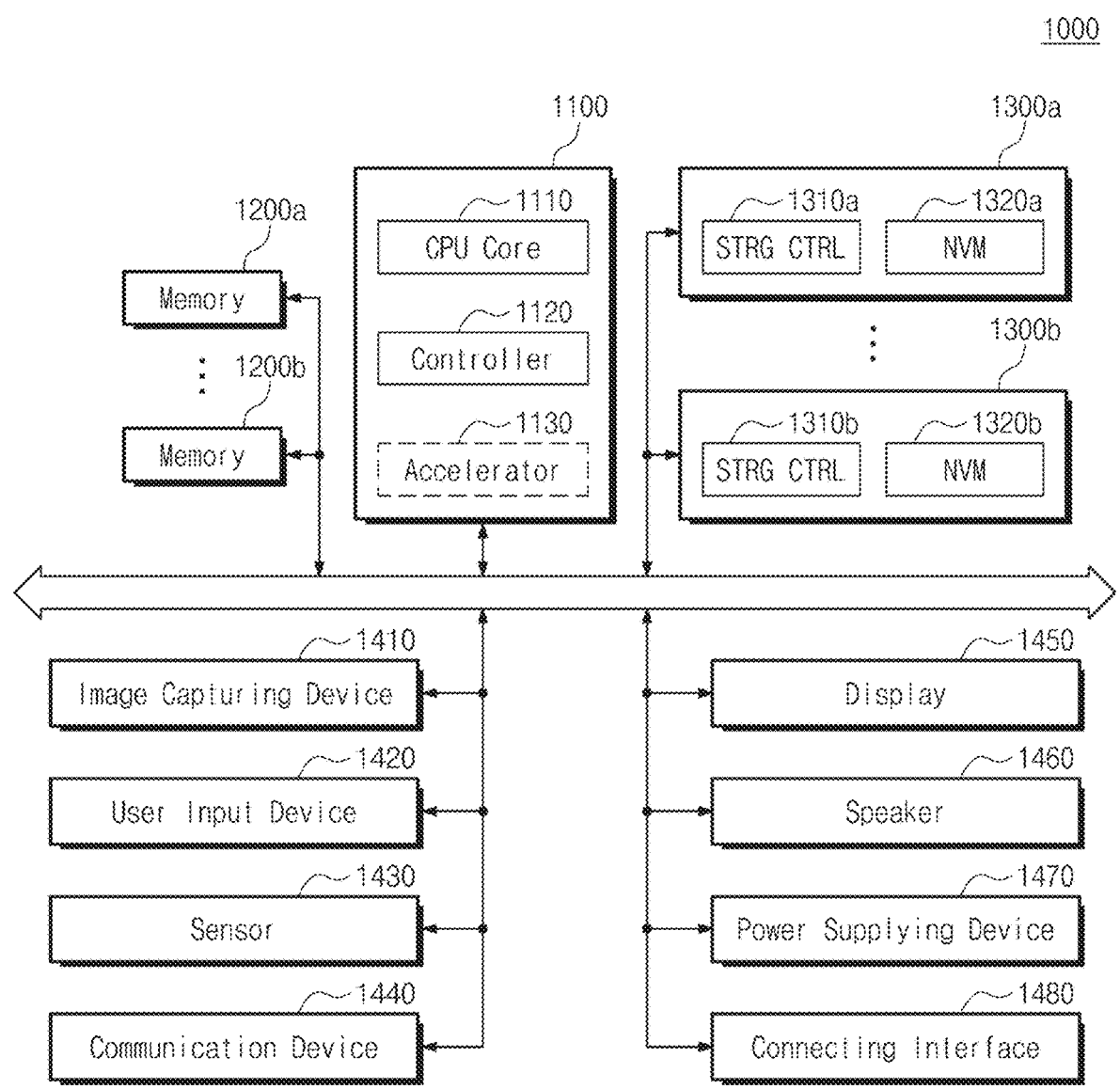
FIG. 14 is a diagram illustrating a system according to an example embodiment of the present disclosure.

FIG. 14 is a diagram of a system 1000 to which a storage device is applied, according to an example embodiment. The system 1000 of FIG. 14 may basically be a mobile system, such as a portable communication terminal (e.g., a mobile phone), a smartphone, a tablet personal computer (PC), a wearable device, a healthcare device, or an Internet of things (IOT) device. However, the system 1000 of FIG. 14 is not necessarily limited to the mobile system and may be a PC, a laptop computer, a server, a media player, or an automotive device (e.g., a navigation device).

Referring to FIG. 14, the system 1000 may include a main processor 1100, memories (e.g., 1200a and 1200b), and storage devices (e.g., 1300a and 1300b). In addition, the system 1000 may include at least one of an image capturing device 1410, a user input device 1420, a sensor 1430, a communication device 1440, a display 1450, a speaker 1460, a power supplying device 1470, and a connecting interface 1480.

The main processor 1100 may control all operations of the system 1000, more specifically, operations of other components included in the system 1000. The main processor 1100 may be implemented as a general-purpose processor, a dedicated processor, or an application processor.

The main processor 1100 may include at least one CPU core 1110 and further include a controller 1120 configured to control the memories 1200a and 1200b and/or the storage devices 1300a and 1300b. In some example embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU) and be implemented as a chip that is physically separate from the other components of the main processor 1100.

The memories 1200a and 1200b may be used as main memory devices of the system 1000. Although each of the memories 1200a and 1200b may include a volatile memory, such as static random access memory (SRAM) and/or dynamic RAM (DRAM), each of the memories 1200a and 1200b may include non-volatile memory, such as a flash memory, phase-change RAM (PRAM) and/or resistive RAM (RRAM). The memories 1200a and 1200b may be implemented in the same package as the main processor 1100.

The storage devices 1300a and 1300b may serve as non-volatile storage devices configured to store data, regardless of whether power is supplied thereto, and have larger storage capacity than the memories 1200a and 1200b. The storage devices 1300a and 1300b may respectively include storage controllers (STRG CTRL) 1310a and 1310b and NVMs (Non-Volatile Memories) 1320a and 1320b configured to store data via the control of the storage controllers 1310a and 1310b. Although the NVMs 1320a and 1320b may include flash memories having a two-dimensional (2D) structure or a three-dimensional (3D) V-NAND structure, the NVMs 1320a and 1320b may include other types of NVMs, such as PRAM and/or RRAM.

The storage devices 1300a and 1300b may be physically separated from the main processor 1100 and included in the system 1000 or implemented in the same package as the main processor 1100. In addition, the storage devices 1300*a* and 1300*b* may have types of solid-state devices (SSDs) or memory cards and be removably combined with other components of the system 1000 through an interface, such as the connecting interface 1480 that will be described below. The storage devices 1300*a* and 1300*b* may be devices to which a standard protocol, such as a universal flash storage (UFS), an embedded multi-media card (eMMC), or a nonvolatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the system 1000 and include a touch pad, a keypad, a keyboard, a mouse, and/or a microphone.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the system 1000 according to various communication protocols. The communication device 1440 may include an antenna, a transceiver, and/or a modem.

The display 1450 and the speaker 1460 may serve as output devices configured to respectively output visual information and auditory information to the user of the system 1000.

The power supplying device 1470 may appropriately convert power supplied from a battery (not shown) embedded in the system 1000 and/or an external power source and supply the converted power to each of components of the system 1000.

The connecting interface 1480 may provide connection between the system 1000 and an external device, which is connected to the system 1000 and capable of transmitting and receiving data to and from the system 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

In an example embodiment, the storage device 100 described with reference to FIGS. 1 to 13 may be implemented with the storage devices 1300*a* and 1300*b*. The storage devices 1300*a* and 1300*b* may differently perform the error correction operation based on an error rate. When the error rate is greater than the first threshold value VCR1, the storage devices 1300*a* and 1300*b* may omit hard decision decoding and may again perform the read retry operation. The read retry operation may be performed for the valley search or the second error correction operation. When the error rate is not greater than the first threshold value VCR1, the storage devices 1300*a* and 1300*b* may perform hard decision decoding.

In the above example embodiments, components according to the present disclosure are described by using the terms "first", "second", "third", etc. However, the terms "first", "second", "third", etc. may be used to distinguish components from each other and do not limit the present disclosure. For example, the terms "first", "second", "third", etc. do not involve an order or a numerical meaning of any form.

In the above example embodiments, components according to example embodiments of the present disclosure are referenced by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit, or circuits enrolled as an intellectual property (IP).

According to the present disclosure, when an estimated error rate is high, a storage device may omit decoding and may perform read retry. Accordingly, a storage device performing error correction at an improved speed and an operating method of the storage device are provided.

Any of the elements and/or functional blocks disclosed above may include or be implemented in processing circuitry such as hardware including logic circuits; a hardware/software combination such as a processor executing software; or a combination thereof. For example, the memory manager 126, controller 1120, accelerator 1130, and STRG CTRL 1310*a*, 1310*b* may be implemented as processing circuitry. The processing circuitry specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Processor(s), controller(s), and/or processing circuitry may be configured to perform actions or steps by being specifically programmed to perform those action or steps (such as with an FPGA or ASIC) or may be configured to perform actions or steps by executing instructions received from a memory, or a combination thereof.

While the present disclosure has been described with reference to example embodiments thereof, it will be apparent to those of ordinary skill in the art that various changes and modifications may be made thereto without departing from the spirit and scope of the present disclosure as set forth in the following claims.

What is claimed is:

1. A storage device comprising:
    a nonvolatile memory device; and
    a memory controller configured to,
        perform a read operation on the nonvolatile memory device, and
        perform an error correction operation on data read in the read operation by,
            estimating an error rate of the read data,
            in response to the estimated error rate being greater than a threshold value, omitting a hard decision decoding operation and performing a read retry operation, and
            in response to the estimated error rate being less than or equal to the threshold value, performing the hard decision decoding operation.

2. The storage device of claim 1, wherein the memory controller is configured to:
calculate a syndrome vector by multiplying the read data and a parity check matrix together; and
estimate a ratio of "1" in the syndrome vector as the error rate.

3. The storage device of claim 1, wherein the memory controller is configured to perform a first soft decision decoding operation following the read retry operation.

4. The storage device of claim 1, wherein, the memory controller is configured to, in the hard decision decoding operation, perform a low density parity check (LDPC) decoding operation on the read data.

5. The storage device of claim 4, wherein the memory controller is configured to:
perform the LDPC decoding operation through a plurality of loops; and
at a first time between the plurality of loops, estimate a second error rate from a result of the LDPC decoding operation of the first time.

6. The storage device of claim 5, wherein, the memory controller is configured to, in response to the estimated second error rate being greater than a first threshold value:
end the LDPC decoding operation; and
determine that the LDPC decoding operation fails in error correction.

7. The storage device of claim 6, wherein,
the memory controller is configured to, at a second time after the first time between the plurality of loops, estimate a third error rate from a result of the LDPC decoding operation of the second time, and
the memory controller is configured to, in response to the estimated third error rate is greater than a second threshold value, end the LDPC decoding operation, and determine that the LDPC decoding operation fails in error correction.

8. The storage device of claim 7, wherein the second threshold value is smaller than the first threshold value.

9. The storage device of claim 4, wherein, the memory controller is configured to, in the hard decision decoding operation and in response to a first LDPC decoding operation for the read data failing, perform valley search and a second LDPC decoding operation.

10. The storage device of claim 1, wherein,
the memory controller is configured to, in the read retry operation, send a read command to the nonvolatile memory device,
the nonvolatile memory device is configured to, in response to the read command, perform a second read operation, and send first data and second data to the memory controller, and
the memory controller is configured to perform a low density parity check (LDPC) decoding operation based on the read data, the first data, and the second data.

11. The storage device of claim 10, wherein
a size of the first data is equal to a size of the read data, and
a size of the second data is equal to the size of the read data.

12. The storage device of claim 10, wherein
the first data correspond to data read by using a read level lower than a read level of the read operation, and
the second data correspond to data read by using a read level higher than the read level of the read operation.

13. The storage device of claim 1, wherein the memory controller is configured to, in response to the error correction operation failing in the hard decision decoding operation or in a first soft decision decoding operation following the read retry operation, perform a second read retry operation and a low density parity check (LDPC) decoding operation for the read data.

14. The storage device of claim 13, wherein,
the memory controller is configured to, in the second read retry operation, send a first read command and a second read command to the nonvolatile memory device,
the nonvolatile memory device is configured to
perform a first read operation in response to the first read command,
send first data to the memory controller,
perform a second read operation in response to the second read command, and
send second data to the memory controller, and
the memory controller is configured to perform the LDPC decoding operation based on the read data, the first data, and the second data.

15. A storage device comprising:
a nonvolatile memory device; and
a memory controller configured to,
perform a read operation on the nonvolatile memory device, and
perform an error correction operation on data read in the read operation by,
estimating an error rate of the read data,
in response to the estimated error rate being greater than a threshold value, omitting a low density parity check (LDPC) decoding operation for the read data and performing a read retry operation of reading additional data from the nonvolatile memory device, and
in response to the estimated error rate being less than or equal to the threshold value, performing the LDPC decoding operation.

16. The storage device of claim 15, wherein, the memory controller is configured to, after performing the read retry operation, perform a soft decision decoding operation based on the read data and the additional data.

17. The storage device of claim 15, wherein,
the memory controller is configured to, in the read retry operation, send one read command to the nonvolatile memory device,
the nonvolatile memory device is configured to perform one read operation, and send the additional data including first data and second data as a result of the one read operation to the memory controller,
a size of the first data is equal to a size of the read data, and
a size of the second data is equal to the size of the read data.

18. An operating method of operating a storage device including a nonvolatile memory device and a memory controller, the method comprising:
sending, at the memory controller, a first read command to the nonvolatile memory device;
performing, at the nonvolatile memory device, a first read operation in response to the first read command and sending first data as a result of the first read operation to the memory controller;
estimating, at the memory controller, an error rate of the first data;
in response to the estimated error rate being equal to or smaller than a threshold value, performing, at the memory controller, a hard decision decoding operation on the first data; and in response to the estimated error rate being greater than the threshold value, sending, at the memory controller, a second read command to the nonvolatile memory device.

19. The method of claim 18, further comprising:
performing, at the nonvolatile memory device, a second read operation in response to the second read command and sending second data and third data as a result of the second read operation to the memory controller; and
performing, at the memory controller, a soft decision decoding operation based on the first data, the second data, and the third data.

\* \* \* \* \*